United States Patent [19]
Lin et al.

[11] Patent Number: 5,818,086
[45] Date of Patent: Oct. 6, 1998

[54] REINFORCED ESD PROTECTION FOR NC-PIN ADJACENT INPUT PIN

[75] Inventors: Shi-Tron Lin, Taipei, Taiwan; Alex C. Wang, Fremont, Calif.; Hsin-Chang Lin, Hsinchu, Taiwan

[73] Assignee: Winbond Electronics Corporation, Hsinchu, Taiwan

[21] Appl. No.: 661,659

[22] Filed: Jun. 11, 1996

[51] Int. Cl.$^6$ .......................... H01L 29/74; H01L 31/111; H01L 23/62; H01L 29/00
[52] U.S. Cl. .......................... 257/355; 257/546; 257/174
[58] Field of Search .......................... 257/355, 546, 257/173, 448

[56] References Cited

U.S. PATENT DOCUMENTS

| | | | |
|---|---|---|---|
| 5,355,344 | 10/1994 | McClure | 257/782 |
| 5,465,189 | 11/1995 | Polgreen et al. | 257/355 |
| 5,610,425 | 3/1997 | Quigley et al. | 257/358 |

*Primary Examiner*—Mahshid D. Saadat
*Assistant Examiner*—Jhihan Clark
*Attorney, Agent, or Firm*—Proskauer Rose LLP

[57] ABSTRACT

In accordance with the invention, an integrated circuit has a first ESD protection circuit for each input pin which is not adjacent a non-wired IC pin and a second ESD protection circuit for each input pin which is adjacent a non-wired pin. The second ESD protection circuit has a greater ESD protection capability than the first ESD protection circuit. The second ESD protection circuit has a capability of protecting an input pin when an ESD stress occurs at an adjacent non-wired pin. The second ESD protection circuit includes, for example, additional ESD protection elements in comparison to the first ESD protection circuit. Alternatively, the second ESD protection circuit has one ESD protection element which is larger in size or is otherwise different than a corresponding ESD protection element in the first ESD protection circuit. The invention has the advantage of not changing the definition of the non-wired IC pins and also does not cost large amounts of chip real estate because the ESD protection circuit is reinforced for only those input pins which are adjacent non-wired pins. The ESD protection circuit is not reinforced for I/O pins, VDD pins, VSS pins, and input pins which are not adjacent non-wired pins.

3 Claims, 3 Drawing Sheets

5,818,086

REINFORCED ESD PROTECTION FOR NC-PIN ADJACENT INPUT PIN

RELATED APPLICATION

The subject matter of this application is related to the subject matter of the following patent applications:

(1) U.S. patent application Ser. No. 08/642,194, entitled, "Method for Preventing Electrostatic Discharge Failure in an Integrated Circuit Package", filed May 6, 1996.

(2) U.S. patent application Ser. No. 08/643,355, entitled, "Method for Preventing Electrostatic Discharge Failure in an Integrated Circuit Package," filed May 6, 1996 for Ta-Lee Yu, Yang-Sen Yeh and Kow-Liang Wen.

The above-listed patents are assigned to the assignee of this application and are incorporated herein by reference.

FIELD OF THE INVENTION

The present invention relates to Electrostatic Discharge (ESD) protection for an Integrated Circuit (IC). In particular, the present invention relates to an ESD failure mechanism wherein ESD stressing on a non-wired pin can cause severe damage to an adjacent input pin. The failure threshold is often lower than if the ESD stress were on the input pin itself. According to the invention, by selectively reinforcing the ESD protection circuits of input pins that are next to non-wired pins, the ESD immunity against the non-wired pin ESD stress can be improved.

BACKGROUND OF THE INVENTION

FIG. 1 schematically illustrates an IC package 10. The package 10 comprises an IC chip (or die) 12. The IC chip 12 has a plurality of bonding pads 14a, 14b, 14c, 14d, and 14e. The chip 12 is mounted on a die pad 16 of a lead frame by a conductive adhesive. A plurality of pins 16a, 16b, 16c, 16d, 16e, and 17 also from part of the package 10. The package 10 is encapsulated in a resin material 20. The pin 16a which is connected to the VSS (or ground) bus of the IC chip and is connected by a bond wire 18a to the bonding pad 14a. The pin 16d which is connected to the VDD bus is connected by a bond wire 18d to the bonding pad 14d. The pin 17 is a non-wired or (NC) pin. The NC pin 17 is not connected by a bonding wire to the IC 12. The pin 16b is an input pin which is adjacent to the NC pin 17. An input pin which is adjacent to a non-wired (NC) pin is designated Adj-IP. An input pin is a pin for inputting data, addresses or other signals to internal circuits of the IC. The input pin 16b is connected to the bonding pad 14b by a bonding wire 18b. The pin 16e is, for example, an input pin which is not adjacent to an NC pin. The pin 16e is connected to the bonding pad 14e by the bonding wire 18e.

The pin 16c may be an I/O pin, i.e., a pin which can output data, addresses or other signals from the IC or which can function as an input pin. The pin 16c is connected to the I/O pad 14c by the bonding wire 18c.

It should be noted that the pins 16a, 16b, 16c, 16d, 16e, and 17 are illustrative. An actual IC package will have numerous pins of the types described above.

The trend of IC packaging is toward higher pin count and narrower pin pitch. There is a new ESD failure mechanism caused by an ESD stress on a non-wired pin, such as, the pin 17 of FIG. 1. This failure mechanism was reported in Matsumoto, et al. "New Failure Mechanism due to Non-Wired Pin ESD Stressing". Proceeding of the EOS/ESD Symposium 1994. In particular, adjacent input pin (Adj-IP) failures were observed when ESD stress is applied to a non-wired pin (NC pin). Thus, the adjacent input pin 16b of FIG. 1 is more likely to fail because of an ESD stress on the non-wired pin 17 than the non-adjacent input pin 16e.

The bond pad associated with an adjacent input pin (e.g., Adj-IP 16b) is typically protected by an ESD protection circuit formed as part of the IC chip. The general observation is that the adjacent input pin can sustain a higher ESD voltage when the ESD stress is applied to the adjacent input pin itself as opposed to the case when the ESD stress is applied to the non-wired pin (e.g., NC pin 17 in FIG. 1).

In an experiment described in the above-identified Matsumoto, et al, reference, repeated Human Body Model (HMD) ESD pulses on the NC pin cause the Adj-IP failure. The explanation provided by Matsumoto, et al. is that there is electrical charge built up in the resin (e.g., resin 20 of FIG. 1) surrounding the NC pin as the ESD pulses were applied to the NC pin. The voltage between the Adj-IP and NC pin will increase accordingly. As shown in FIG. 1, due to the narrow gap 11 between adjacent pins, when the voltage between the Adj-IP and NC pin reaches a critical value, there will be a sudden discharge across the gap accompanied by high current.

In an experiment performed at Winbond Electronics Corp., assignee of this invention, similar results have be observed. An Adj-IP, with a conventional ESD protection circuit (see e.g., FIG. 3a), can sustain a 3KV HBM-ESD pulse. But the Adj-IP failed (leakage to VSS) when a 1.5–2.0 KV ESD pulse was applied to the NC pin, In contrast, an I/O pin adjacent to an NC pin can sustain a much higher ESD stress voltage (up to 3 KV) applied to the NC pin without showing leakage on the I/O pin. In addition, the I/O pin is also connected to an output buffer in the IC consisting of large NMOS and PMOS transistors.

The ESD protection for an I/O pin is typically more robust than that of an input pin due to the associated large output buffer which helps dissipate the ESD energy. An input cell including an ESD protection circuit is typically smaller than an I/O cell in order to optimize the chip area utilized.

FIG. 2 schematically illustrates a solution to the above described ESD failure mechanism, disclosed in U.S. patent application Ser. No. 08/642,194, entitled, "Method for Preventing Electrostatic Discharge Failure in an Integrated Circuit Package," filed May 6, 1996 for Ta-Lee Yu, Yang-Sen Yeg and Kow-Liang Wen incorporated herein by reference, wherein ESD stressing on a non-wired (NC) pin can cause severe damage to an adjacent input pin (Adj-IP). In FIG. 2, the NC pin 17 is bonded to the lead frame (in particular the die pad 16 which is part of the lead frame) via the bonding wire 19. The die pad 16 is electrically connected to the substrate of the IC chip 12. Depending on whether the IC substrate is N-type or P-type, the NC pin is then electrically connected to VDD or VSS and all NC pins are effectively shorted together.

The advantage of this solution is that the ESD energy is well absorbed by the power rail ESD protection elements. The disadvantage of this solution is that the definition of the NC pins is changed.

The NC pins are often reserved for data, address, or other signals for the next generation product. For example, manufacturers of mother boards for use in personal computers prefer to design a mother board which is plug-in ready for the next generation of CPU (e.g., 64-bit CPU versus 32-bit CPU). In the next generation product, a pin that is now a non-wired (NC) pin may be connected to an active circuit in a next generation IC. Therefore, there is a disadvantage to converting an NC pin into a VDD pin or VSS pin as is done in FIG. 2.

In another solution disclosed in U.S. patent application Ser. No.08/643,355 entitled, "Method for Preventing Electrostatic Discharge Failure in an Integrated Circuit Package", filed May 6, 1996 for Ta-Lee Yu, Yang-Sen Yeg and Kow-Liang Wen, which is incorporated herein by reference, the NC pin is connected to an adjacent non-NC pin, which can be an input, I/O, VDD, or VSS pin. However, this also has the disadvantage of changing the definition of the NC pin.

In view of the foregoing, it is an object of the invention to provide a solution to the ESD failure mechanism wherein an ESD stress to a non-wired pin damages an adjacent input pin.

Specifically, it is an object of the invention to provide a solution to this ESD failure mechanism which does not change the definition of the NC pin.

It is also an object of the invention to provide a solution to this ESD failure mechanism which conserves chip real estate.

SUMMARY OF THE INVENTION

In accordance with the invention, an integrated circuit has a first ESD protection circuit for each input pin which is not adjacent a non-wired pin and a second ESD protection circuit for each input pin which is adjacent a non-wired pin. The second ESD protection circuit has a greater ESD protection capability than the first ESD protection circuit. The second ESD protection circuit has a capability of protecting an input pin when an ESD stress occurs at an adjacent non-wired pin. The second ESD protection circuit includes, for example, additional ESD protection elements in comparison to the first ESD protection circuit. Alternatively, the second ESD protection circuit has one ESD protection element which is larger in size or is different than a corresponding ESD protection element in the first ESD protection circuit.

The invention has the advantage of not changing the definition of the non-wired pins and also does not cost large amounts of chip real estate because the ESD protection circuit is reinforced for only those input pins which are adjacent non-wired pins. The ESD protection circuit is not reinforced for I/O pins, VDD pins, VSS pins, and input pins which are not adjacent non-wired pins.

DETAILED DESCRIPTION OF THE INVENTION

In accordance with the invention, in an IC package, an input pin which is adjacent to a non-wired pin is provided with an enhanced electrostatic discharge protection circuit 30 comparison to an input pin which is not adjacent to a non-wired pin.

This has the significant advantage that the definition of the non-wired pin is not changed.

There are several enhancements which may be provided in the IC for the ESD protection circuit of an input pin (Adj-IP) which is adjacent to non-wired (NC) pin. These are as follows.

Category I: Add an Additional ESD Protection Element

Figure 1:
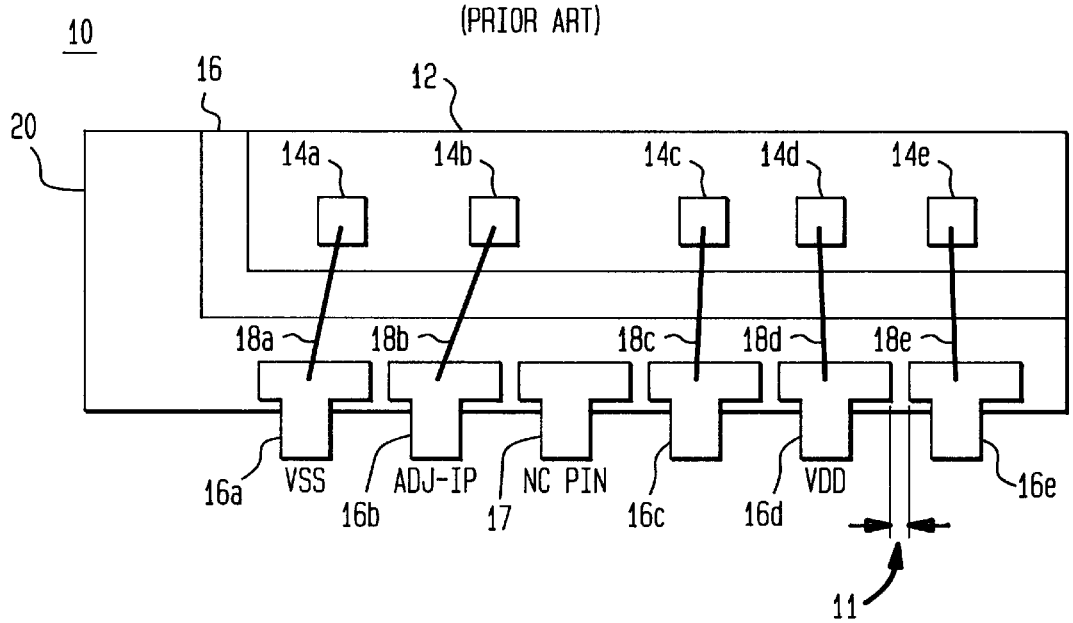
FIG. 1 schematically illustrates arrangement of pins in a conventional IC package.
Figure 2:
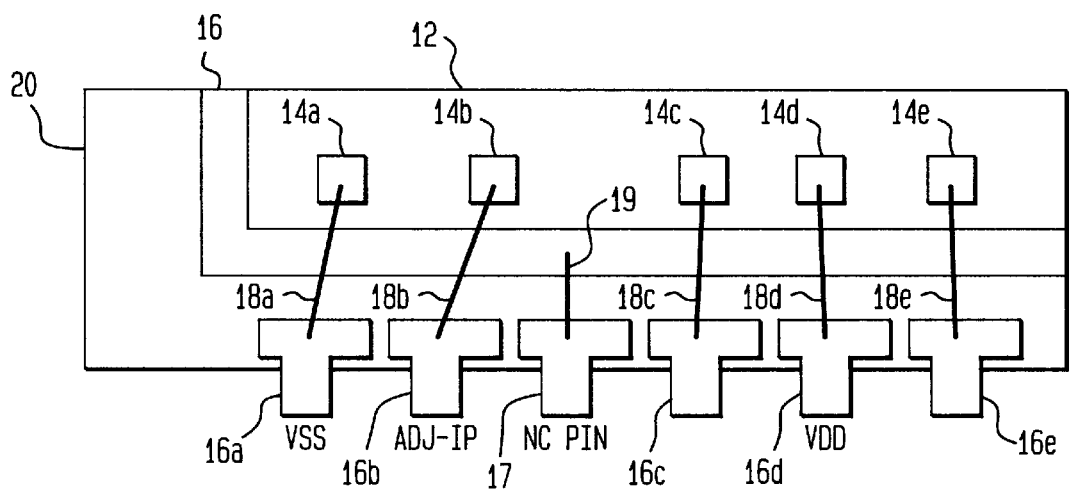
FIG. 2 illustrates an IC package in which the pins are arranged to prevent an electrostatic discharge stress at a non-wired pin from damaging the IC.
Figure 3A:
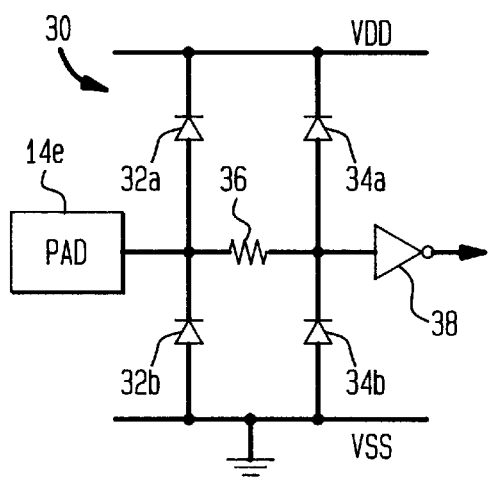
FIGS. 3a–3b illustrate first and second ESD protection circuits according to one embodiment of the invention.

FIG. 3a shows an ESD protection circuit 30 which may be used for an input pin such as the pin 16e of FIG. 1 which is not adjacent to an NC pin. The ESD protection circuit 30 comprises two primary diodes 32a, 32b, two secondary diodes 34a, 34b, and a resistor 35. The ESD protection elements are the primary and secondary diodes. The input signals arrive at the bonding pad 14e and are outputted into the internal circuits of the IC via the inverter 38.

Figure 3B:
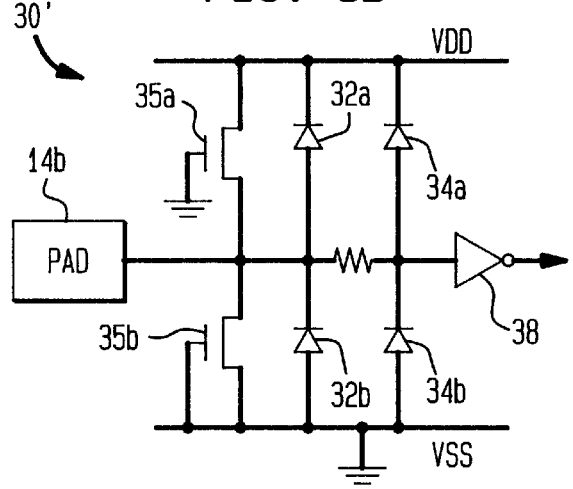

FIG. 3b shows an ESD protection circuit 30' which provides ESD protection for an input pin (Adj-IP) which is adjacent an NC pin, (e.g., the Adj-IP pin 16b which is adjacent the NC pin 17 in FIG. 1). The ESD protection circuit 30' includes two grounded gate NMOS devices 35a, 35b which serve as additional ESD protection elements. The NMOS devices 35a, 35b are in the offstate during normal operation, but can help absorb the ESD energy from the adjacent NC pin ESD stress.

For example, the NMOS devices 35a, 35b have a channel length of 0.5 microns and a total width of 200 microns. The primary diodes 32a, 32b can be made smaller to accommodate the pin-capacitance requirement.

Figure 4A:
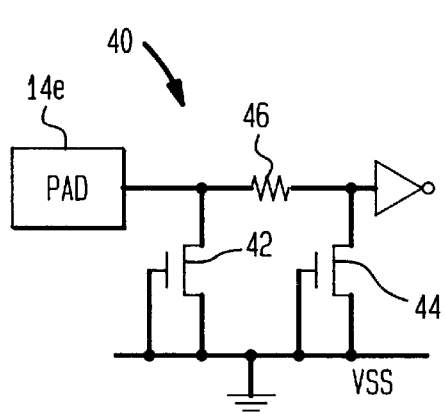
FIGS. 4a–4b illustrate first and second ESD protection circuits according to a second embodiment of the invention.
Figure 4B:
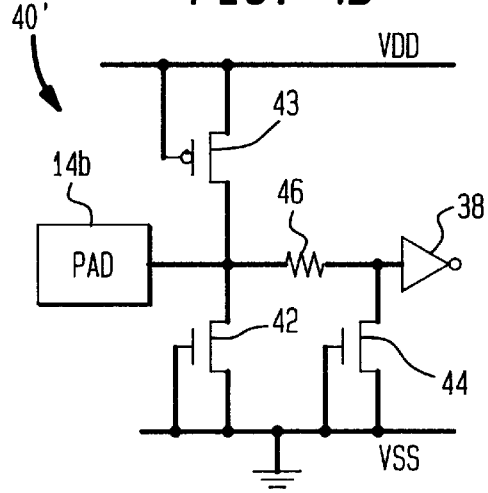

Another example of ESD protection circuits in which an ESD protection element is added for the Adj-IP pin is shown in FIGS. 4a and 4b. FIG. 4a shows an ESD protection circuit for an input pin (e.g., pin 16e of FIG. 1) which is not adjacent to a non-wired pin. The ESD protection circuit 40 of FIG. 4a comprises two ESD protection elements in the form of NMOS devices 42 and 44 and a resistor 46. The NMOS devices 42 and 44 have their gates connected to Vss (ground). The input signals from the input pin arrive at the pad 14e and are outputted by the ESD protection circuit 40 to the internal circuits of the IC by the inverter 38. As shown in FIG. 4b, for an Adj-IP pin such as pin 16b of FIG. 1, an additional pull-up PMOS device 43 is added. The device 43 has its gate tied to the supply voltage VDD. The PMOS device 43 has for example, a channel length of 0.6 microns and a total width of 250 microns.

Category II: Increase the Size of at Least One ESD Protection Element

Meaningful improvement of ESD performance is achieved by increasing the size of the ESD protection elements by about 20% or more. Examples of characteristics whose size can be increased include: diode area, total channel width of an MOS device, and total base width of a bipolar transistor.

Figure 5A:
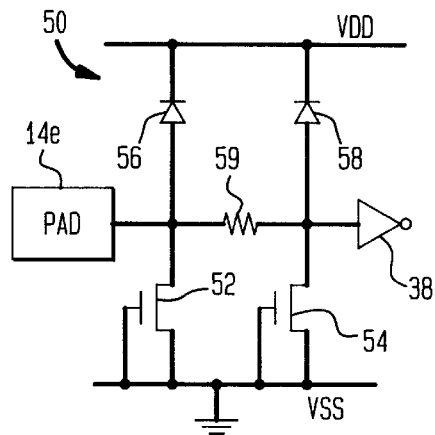
FIGS. 5a–5b illustrate first and second ESD protection circuits according to a third embodiment of the invention.

FIG. 5a shows an ESD protection circuit 50 which may be utilized in an IC for an input pin (e.g., pin 16e of FIG. 1) which is not adjacent to a non-wired pin. The ESD protection elements are two pull-down NMOS devices 52, 54, two pull-up diodes 56, 58 and a resistor 59. The input signals arrive at the input pad 14e and exit the ESD protection circuit via the inverter 38.

Figure 5B:
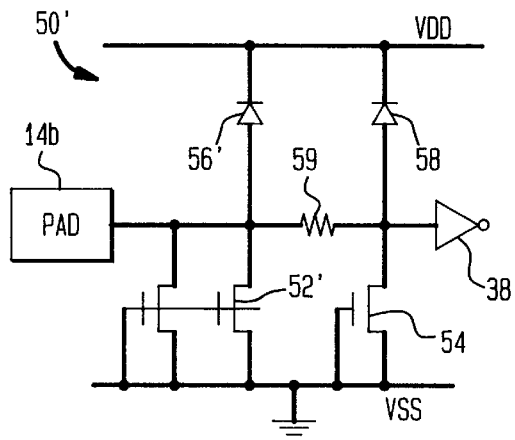

FIG. 5b shows how the circuit 50 is modified for use with an input pin adjacent a non-wired pin. In the ESD protection circuit 50' of FIG. 5b, the diode 56' replaces the diode 56. The diodes 56, 56' are p+/n well diodes and in the diode 56' the p+ diffusion area is increased 80%.

In addition, the grounded gate NMOS device 52' has a width which is 50% larger than the corresponding ESD protection element 52 in the ESD protection circuit 50.

Category III: Replace at Least One ESD Protection Element by a Different ESD Protection Element that is at Least 20% Larger in Area The larger area of the replacement element enables more robust ESD protection.

Figure 6A:
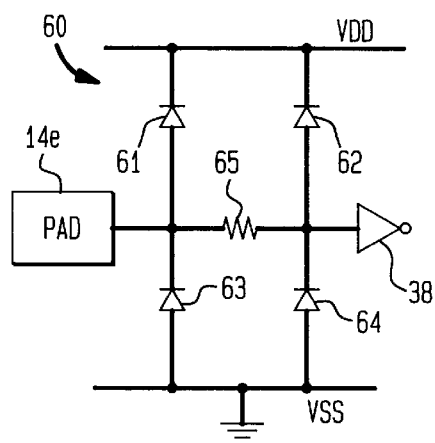
FIGS. 6a–6b illustrate first and second ESD protection circuits according to a fourth embodiment of the invention.

FIG. 6a shows an ESD protection circuit for an input pin which is not adjacent to a non-wired pin (e.g., the input pin 16e of the FIG. 1). The ESD protection circuit 60 of FIG. 6a has four ESD protection elements. These are the primary pull-up diode 61, the secondary pull-up diode 62, the primary pull-down diode 63, and the secondary pull-down diode 64. The circuit also includes the resistor 65. The input signals arrive from the input pin at the pad 14e and exit the ESD protection circuit 60 via the inverter 38.

Figure 6B:
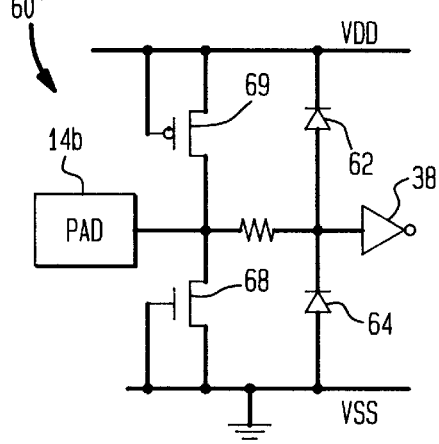

FIG. 6b shows how the ESD protection circuit 60 is modified for use at an input pin (e.g., 16b) which is adjacent a non-wired pin (e.g., pin 17). The primary pull-down diode 63 is replaced with the grounded gate NMOS transistor 68. The primary pull-up diode 61 is replaced by a PMOS transistor 69 with its gate tied to the supply voltage VDD. The NMOS device 68 and the PMOS device 69 each have a channel length of 0.5 microns and a total width of 200 microns. Illustratively, the transistors 68, 69 have a combined silicon area twice as large as the two replaced diodes.

In the foregoing example, diodes and MOSFETs were utilized as the ESD protection elements. However, the ESD protection elements may also be resistors, bipolar devices, SCR devices, Zener diodes, field devices, etc. The same improvement mechanisms described in the above-mentioned three categories are applicable when various different kinds of devices are used for the ESD protection elements of an ESD protection circuit for an input pin of an IC.

As noted above, I/O pins or other pins attached to output buffers have a greater resistance to ESD protection. Illustratively, such pins are not provided additional ESD protection according to the invention, even if they are adjacent to NC pins. Rather, they are provided ordinary ESD protection circuits. This conserves IC chip area without sacrificing ESD protection; the combination of the output buffer and ordinary ESD protection circuit provide sufficient protection.

Finally, the above-described embodiments of the invention are intended to be illustrative only. Numerous alternative embodiments may be devised by those skilled in the art without departing from the spirit and scope of the following claims.

The claimed invention is:

1. An integrated circuit package comprising:
   a semiconductor chip,
   one or more non-wired IC pins which are not connected to said chip by a bonding wire,
   a set of input pins each of which is connected by a bonding wire to a bonding pad on said chip for inputting signals to said chip, said set of input pins including a first subset of input pins each of which is non-adjacent to at least one of said non-wired pins and a second subset of input pins each of which is adjacent to at least one of said non-wired pins, and
   said semiconductor chip including a first electrostatic discharge protection circuit corresponding to each input pin in said first subset, and said semiconductor chip including a second electrostatic discharge protection circuit corresponding to each input pin in said second subset, said second electrostatic discharge protection circuit providing a greater level of ESD protection than said first electrostatic discharge protection circuit, being capable of protecting said input pins in said second subset from an electrostatic discharge applied to an adjacent one of said non-wired pins. and having a greater number of electrostatic discharge protection elements than said first electrostatic discharge protection circuit.

2. An integrated circuit package comprising:
   a semiconductor chip,
   one or more non-wired IC pins which are not connected to said chip by a bonding wire,
   a set of input pins each of which is connected by a bonding wire to a bonding pad on said chip for inputting signals to said chip, said set of input pins including a first subset of input pins each of which is non-adjacent to at least one of said non-wired pins and a second subset of input pins each of which is adjacent to at least one of said non-wired pins, and
   said semiconductor chip including a first electrostatic discharge protection circuit corresponding to each input pin in said first subset, and said semiconductor chip including a second electrostatic discharge protection circuit corresponding to each input pin in said second subset, said second electrostatic discharge protection circuit providing a greater level of ESD protection than said first electrostatic discharge protection circuit, being capable of protecting said input pins in said second subset from an electrostatic discharge applied to an adjacent one of said non-wired pins, and having at least one electrostatic discharge protection element which is larger in size than a corresponding electrostatic discharge protection element in said first electrostatic discharge protection circuit.

3. An integrated circuit package comprising:
   a semiconductor chip,
   one or more non-wired IC pins which are not connected to said chip by a bonding wire,
   a set of input pins each of which is connected by a bonding wire to a bonding pad on said chip for inputting signals to said chip, said set of input pins including a first subset of input pins each of which is non-adjacent to at least one of said non-wired pins and a second subset of input pins each of which is adjacent to at least one of said non-wired pins, and
   said semiconductor chip including a first electrostatic discharge protection circuit corresponding to each input pin in said first subset, and said semiconductor chip including a second electrostatic discharge protection circuit corresponding to each input pin in said second subset, said second electrostatic discharge protection circuit providing a greater level of ESD protection than said first electrostatic discharge protection circuit, being capable of protecting said input pins in said second subset from an electrostatic discharge applied to an adjacent one of said non-wired pins, and having at least one electrostatic discharge protection element which is at least 20% larger in area than a corresponding electrostatic discharge protection element in said first electrostatic discharge protection circuit.

* * * * *